(12) United States Patent
Zhao

(10) Patent No.: US 11,011,095 B2
(45) Date of Patent: May 18, 2021

(54) DISPLAY PANEL, AND IMAGE CONTROL DEVICE AND METHOD THEREOF

(71) Applicants: CHONGQING HKC OPTOELECTRONICS TECHNOLOGY CO., LTD., Chongqing (CN); HKC CORPORATION LIMITED, Guangdong (CN)

(72) Inventor: Wenqin Zhao, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 128 days.

(21) Appl. No.: 16/225,133

(22) Filed: Dec. 19, 2018

(65) Prior Publication Data

US 2020/0074909 A1 Mar. 5, 2020

Related U.S. Application Data

(63) Continuation-in-part of application No. PCT/CN2018/112142, filed on Oct. 26, 2018.

(51) Int. Cl.
*G09G 3/20* (2006.01)
*H01L 27/32* (2006.01)
(Continued)

(52) U.S. Cl.
CPC .......... *G09G 3/2003* (2013.01); *G06F 3/013* (2013.01); *G06F 9/3004* (2013.01);
(Continued)

(58) Field of Classification Search
CPC ..... G09G 3/2003; G06F 9/3004; G06F 3/013; H01L 27/3213; H04N 9/69
See application file for complete search history.

(56) References Cited

U.S. PATENT DOCUMENTS 4,354,737 A * 10/1982 Dotsko ................. G03B 21/56
359/443
6,624,828 B1 * 9/2003 Dresevic ............... G06F 1/1607
345/594
(Continued)

FOREIGN PATENT DOCUMENTS

CN 103390394 A 11/2013
CN 106023930 A 10/2016
(Continued)

OTHER PUBLICATIONS

Chinese Office Action for Chongqing HKC Optoelectronics Technology Co., Ltd. et al., Chinese Application No. 201811014308.6.
(Continued)

*Primary Examiner* — Nitin Patel
*Assistant Examiner* — Robert M Stone
(74) *Attorney, Agent, or Firm* — Westbridge IP LLC

(57) ABSTRACT

The present application relates to the technical field of display and provides a display panel and an image control device and an image control method thereof; wherein, the image control device includes a high-voltage gamma module, a low-voltage gamma module and a first selection module.

16 Claims, 6 Drawing Sheets

(51) Int. Cl.
  *G06F 3/01* (2006.01)
  *H04N 9/69* (2006.01)
  *G06F 9/30* (2018.01)
  *H04N 5/202* (2006.01)

(52) U.S. Cl.
  CPC ......... *H01L 27/3213* (2013.01); *H04N 5/202* (2013.01); *H04N 9/69* (2013.01)

(56) References Cited

U.S. PATENT DOCUMENTS

| | | | | | |
|---|---|---|---|---|---|
| 6,674,436 | B1* | 1/2004 | Dresevic | ............... | G06F 1/1607 345/3.1 |
| 7,134,091 | B2* | 11/2006 | Dresevic | ............... | G06F 1/1607 715/771 |
| 7,623,105 | B2* | 11/2009 | Li | ......................... | H04N 9/643 345/88 |
| 7,936,325 | B2* | 5/2011 | Miyata | ................. | G09G 3/3648 345/690 |
| 8,305,389 | B2* | 11/2012 | Ahn | ...................... | G09G 3/3611 345/589 |
| 8,310,426 | B2* | 11/2012 | Umeda | ................ | G09G 3/3648 345/690 |
| 8,952,890 | B2* | 2/2015 | Iida | ......................... | G06F 3/011 345/156 |
| 9,478,161 | B2* | 10/2016 | Oh | ......................... | H04N 5/202 |
| 9,489,043 | B2* | 11/2016 | Iida | ......................... | H04N 9/64 |
| 10,657,872 | B2* | 5/2020 | Tien | ....................... | G09G 3/3614 |
| 2004/0008208 | A1* | 1/2004 | Dresevic | ................. | G09G 5/00 345/589 |
| 2005/0012755 | A1* | 1/2005 | Dresevic | .............. | A63B 71/023 345/581 |
| 2005/0117186 | A1* | 6/2005 | Li | ........................... | G06F 3/012 359/15 |
| 2006/0290626 | A1* | 12/2006 | Arimoto | .................. | G09G 3/36 345/87 |
| 2008/0036718 | A1* | 2/2008 | Lee | ...................... | G09G 3/3607 345/88 |
| 2008/0303767 | A1* | 12/2008 | Ludden | ................... | H04N 9/69 345/89 |
| 2009/0141010 | A1* | 6/2009 | Liao | .................... | G02F 1/13624 345/205 |
| 2009/0153594 | A1* | 6/2009 | Umeda | ................ | G09G 3/3648 345/690 |
| 2010/0026720 | A1* | 2/2010 | Hotta | .................... | G06F 1/1622 345/652 |
| 2010/0156925 | A1* | 6/2010 | Ahn | ...................... | G09G 3/3611 345/589 |
| 2012/0293405 | A1* | 11/2012 | Iida | ......................... | G06F 3/011 345/156 |
| 2013/0278790 | A1* | 10/2013 | Oh | ........................ | G09G 3/3611 348/223.1 |
| 2014/0146069 | A1* | 5/2014 | Tan | ......................... | G06F 3/011 345/589 |
| 2015/0185830 | A1* | 7/2015 | Iida | ................ | H04N 21/440263 345/156 |
| 2016/0035292 | A1* | 2/2016 | Lee | ...................... | G09G 3/3648 345/694 |
| 2016/0202758 | A1* | 7/2016 | Peana | ...................... | G09G 5/10 345/601 |
| 2017/0025058 | A1* | 1/2017 | Oh | ........................ | H04N 5/202 |
| 2017/0278483 | A1* | 9/2017 | Miyazawa | ........... | G09G 3/3611 |
| 2018/0114478 | A1* | 4/2018 | Tien | ....................... | G09G 3/3614 |
| 2019/0051230 | A1* | 2/2019 | Jeon | ....................... | H01L 27/3211 |
| 2019/0340984 | A1* | 11/2019 | Zhao | ....................... | H04N 9/69 |

FOREIGN PATENT DOCUMENTS

| | | |
|---|---|---|
| CN | 107230446 A | 10/2017 |
| CN | 107481689 A | 12/2017 |
| CN | 107529049 A | 12/2017 |
| CN | 107799066 A | 3/2018 |
| CN | 108320716 A | 7/2018 |
| CN | 108335678 A | 7/2018 |

OTHER PUBLICATIONS

International Search Report for Chongqing HKC Optoelectronics Technology Co., Ltd. et al., International Application No. PCT/CN2018/112142, filed Aug. 31, 2018.

* cited by examiner

DISPLAY PANEL, AND IMAGE CONTROL DEVICE AND METHOD THEREOF

CROSS-REFERENCE TO RELATED APPLICATION

This application is a continuation-in-part application of International Application No. PCT/CN2018/112142 with an international filing date of Oct. 26, 2018 designating US and claims priority to Chinese Patent Application No. 201811014308.6, filed on Aug. 31, 2018, the content of which is incorporated herein by reference in its entirety.

TECHNICAL FIELD

The present application relates to the technical field of display, and more particularly to a display panel, and an image control device and an image control method of the display panel.

BACKGROUND

With the continuous development of display technology, display equipment including liquid crystal display panel and display is continuously developed towards thinner, large-screen, low power consumption and low cost. Image quality is an important display index of the display panel, and viewing angle of chromaticity is an important index for evaluating an image quality of a wide viewing angle type of display panel.

SUMMARY

Image contrast ratio of an existing display panel, particularly, a wide viewing angle type of display panel is obviously reduced at a large viewing angle, which causes images to be whiter and a display effect to be poorer.

Embodiments of the present application provide a display panel and an image control device and method thereof, which aims at solving a problem that image contrast ratio of an existing display panel, particularly, a wide viewing angle type of display panel is obviously reduced at a large viewing angle, which causes images to be whiter and display effect to be poorer.

A first aspect of the embodiments of the present application provides an image control device, including:
a memory; and
a processor;
the processor is configured to execute program modules stored in the memory to implement image control, and the program modules include:
a high-voltage gamma module configured to, upon receiving of driving data, adjust a voltage of a drive signal corresponding to a main sub-pixel in the driving data into a high voltage to obtain and output a first driving data;
a low-voltage gamma module, wherein an input of the low-voltage gamma module is connected with an input of the high-voltage gamma module, and the low-voltage gamma module is configured to adjust, upon receiving of the driving data, a voltage of the drive signal corresponding to a subordinate sub-pixel in the driving data into a low voltage to obtain and output a second driving data; and
a first selection module, wherein a first input of the first selection module is connected with an output of the high-voltage gamma module, a second input of the first selection module is connected with an output of the low-voltage gamma module, and the first selection module is configured to select a target drive signal corresponding to a target sub-pixel from the first driving data or from the second driving data according to the arrangement of sub-pixels in a pixel array, upon receiving of the first driving data and the second driving data.

A second aspect of the embodiments of the present application provides an image control method, including:
adjusting, upon receiving of driving data, a voltage of a drive signal corresponding to a main sub-pixel in the driving data into a high voltage to obtain first driving data;
adjusting a voltage of a drive signal corresponding to the subordinate sub-pixel in the driving data into a low voltage to obtain second driving data;
selecting, according to the arrangement of sub-pixels in a pixel array, a target drive signal corresponding to a target sub-pixel from the first driving data or from the second driving data; and
outputting the target drive signal to the pixel array to drive the target sub-pixel.

A third aspect of the embodiments of the present application provides a display panel, including: a memory, a processor and computer program stored in the memory and executable by the processor, wherein the display panel further comprises a pixel array, and the pixel array comprises a plurality of pixels, a sub-pixel of each of the pixels is divided into a main sub-pixel and subordinate sub-pixel, an adjacent sub-pixel of any main sub-pixel in the pixel array is the subordinate sub-pixel, and an adjacent sub-pixel of any subordinate sub-pixel is the main sub-pixel, when the computer program is executed by the processor, the processor is configured to implement steps in the aforesaid image control method.

A fourth aspect of the present application provides a computer readable storage medium, the computer readable storage program stores computer program, when the computer program is executed by a processor, the processor is configured to implement steps in the aforesaid image control method.

In the embodiments of the present application, each of sub-pixels in the display panel is divided into a main sub-pixel and a subordinate sub-pixel, so that the primary attribute and the secondary attribute of any two adjacent sub-pixels are different; then, the viewing angle of human eyes when the display panel is watched by human eyes is detected, upon receiving of the driving data, the gain value of the driving data is adjusted according to the viewing angle, and the voltage of the drive signal corresponding to the main sub-pixel in the driving data is adjusted into a high voltage, and the first driving data is obtained; the voltage of the drive signal corresponding to the subordinate sub-pixel in the driving data is adjusted into a low voltage, and the second driving data is obtained. The target drive signal corresponding to the target sub-pixel is selected from the first driving data or from the second driving data and is output to the display panel to drive the target sub-pixels; by mixing and displaying the sub-pixels and the sub-pixels under different voltages, a viewing angle of chromaticity is improved, and a large viewing angle function is achieved.

When the gain value is greater than the gain threshold value, the voltage of the target drive signal is adjusted according to the gain value and is output to the display panel to drive the target sub-pixel; when the gain value is less than or equal to the gain threshold value, the driving data is directly output to the display panel; the large viewing angle function can be closed when human eyes directly face the display panel, the large viewing angle performance of the display panel can be dynamically adjusted according to the viewing angle of human eyes, opening and closing of the large viewing angle function can be controlled, and power consumption can be reduced.

BRIEF DESCRIPTION OF THE DRAWINGS

In order to explain the embodiments of the present application more clearly, a brief introduction regarding the accompanying drawings that need to be used for describing the embodiments or the prior art is given below; it is obvious that the accompanying drawings described as follows are only some embodiments of the present application, for the ordinarily skilled one in the art, other drawings can also be obtained according to the current drawings on the premise of paying no creative labor.

DESCRIPTION OF THE EMBODIMENTS

In order to make the technical solutions of the present application be more understandable by the one of ordinary skill in the art, the technical solutions in the embodiments of the present application will be described clearly with reference to accompanying drawings in the embodiments; it is obvious that, the embodiments described below are only a part of the embodiments of the present application, but not the entire of the embodiments. Based on the embodiments in the present application, some other embodiments, which are obtained by the one of ordinary skill in the art at the premise of paying no creative labor, should all be included in the protection scope of the present application.

A term "comprise/include" in the description, the claims and the accompanying figures of the present application and their various deformations are intended to cover non-exclusive comprising/including, such as including a process of a list of steps of units, method and system, product and device are not limited to the listed steps or units, however, optionally, the steps or units which are not listed are further included, or optionally, other inherent steps or units for these steps, methods, product and device are further included. Besides, terms including "first", "second" and "third" are intended to distinguish different objects but not used for describing specific sequences.

Embodiment One

Figure 1:
FIG. 1 illustrates a schematic structural diagram of a display panel provided by embodiment one of the present application.

As shown in FIG. 1, this embodiment provides a pixel array 1 which includes a plurality of pixels, a sub-pixel of each of the pixels are divided into a main sub-pixel and a subordinate sub-pixel, an adjacent sub-pixel of any main sub-pixel in the pixel array is the subordinate sub-pixel, and an adjacent sub-pixel of any subordinate sub-pixel is the main sub-pixel.

In application, each of the pixels at least includes three sub-pixels of red, green and blue, and can also include a fourth sub-pixel, the color of the fourth sub-pixel can be white or yellow, any sub-pixel in each of the pixels can be set as the main sub-pixel or the subordinate sub-pixel according to actual needs.

FIG. 1 illustrates an exemplary pixel array 1 composed of 4*6 sub-pixels, wherein, the colors of sub-pixels from the first column to the sixth column are red, green, blue, red, green and blue respectively. In application, other arrangements can also be set according to actual needs as long as the main attribute and the subordinate attribute of adjacent sub-pixels are different.

In application, the display panel includes a pixel array consisting of a plurality of rows and a plurality of columns of sub-pixels, each row sub-pixel is connected with a source electrode driving module, each column sub-pixel is connected with the grid electrode driving module, and the row number and the column number of the pixel array can be set as needed; in this embodiment, the size of the pixel array is not particularly limited. The source driving module can be any device or circuit that is capable of performing a data driving function on the pixels of the display panel such as a source driver IC (Integrated Circuit) or a S-COF (Source-Chip on Film), or the like.

Figure 2:
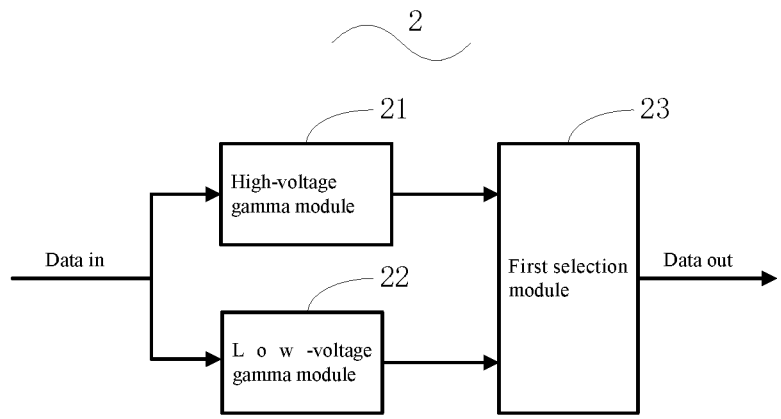
FIG. 2 illustrates a schematic structural diagram of an image control device provided by embodiment one of the present application.

As shown in FIG. 2, this embodiment further provides an image control device, the display panel includes the pixel array which conforms to the pixel arrangement rule and the primary and subordinate attribute division; In one embodiment, the image control device 2 includes: a memory and a processor; where the processor is configured to execute program modules stored in the memory to implement image control, and the program modules comprise:

a high-voltage gamma module 21 configured to adjust the voltage of the drive signal corresponding to the main sub-pixel in the driving data is adjusted into a high voltage to obtain and output a first driving data, upon receiving of the driving data.

In application, the high voltage is higher than the voltage required for normal displaying of the main sub-pixel. The high-voltage gamma module can be implemented by a display parameter look-up-table, and can also be implemented by input data having the same function as the display parameter look-up-table, that is, by searching other data table of the corresponding output data or storage medium such as RAM (Random Access Memory) according to the input data.

Figure 3:
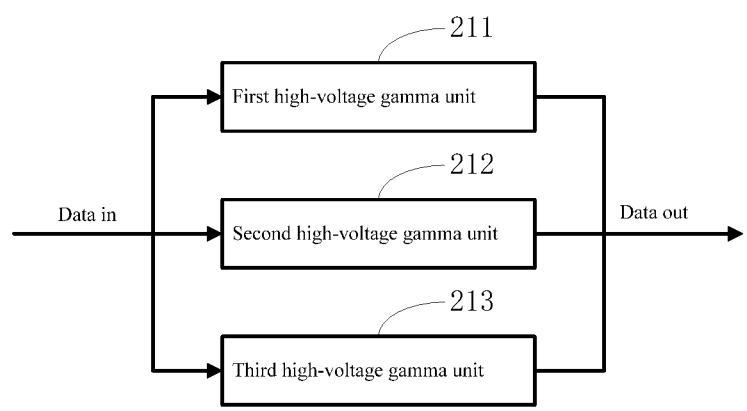
FIG. 3 illustrates a schematic structural diagram of a high-voltage gamma module provided by embodiment one of the present application.

As shown in FIG. 3, in this embodiment, the high-voltage gamma module 21 includes:

a first high-voltage gamma unit 211 configured to adjust a voltage of a drive signal corresponding to a first color main sub-pixel in the driving data to be a first high voltage to obtain and output a first driving data, upon receiving of the driving data;

a second high-voltage gamma unit 212 configured to adjust a voltage of a drive signal corresponding to a second color main sub-pixel in the driving data to be a second high voltage to obtain and output a first driving data, upon receiving of the drive data;

a third high-voltage gamma unit 213 configured to adjust a voltage of a drive signal corresponding to a third color main sub-pixel in the driving data to be a third voltage to obtain and output a first driving data, upon receiving of the driving data.

Wherein, an input of the first high-voltage gamma unit 211, an input of the second high-voltage gamma unit 212 and an input of the third high-voltage gamma unit 213 are in common connection to form an input (Data in) of the high-voltage gamma module 21, an output of the first high-voltage gamma unit 211, an output of the second high-voltage gamma unit 212 and an output of the third high-voltage gamma unit 213 are in common connection to form an output (Data out) of the high-voltage gamma module 21.

In application, the first high-voltage gamma unit 211, the second high-voltage gamma unit 212 and the third high-voltage gamma unit 213 respectively include the display parameter look-up-table and are realized by the display parameter look-up-table, and can also be realized by input data having the same function as the display parameter look-up-table, that is, by searching other data table of the corresponding output data or storage medium such as RAM according to the input data.

In application, the first color, the second color and the third color are different from each other and are one of red, green and blue respectively. The first high voltage is higher than a voltage required for normal displaying of the main sub-pixel of the first color, the second high voltage is higher than a voltage required for normal displaying of the sub-pixel of the second color, and the third high-high voltage is higher than a voltage required for normal displaying of the main sub-pixel of the third color.

The low-voltage gamma module 22, which has the input connected with the input of the high-voltage gamma module 21, is configured to adjust the voltage of the drive signal corresponding to the subordinate sub-pixel in the driving data into a low voltage to obtain and output a second driving data, upon receiving of the driving data.

In application, the low voltage is lower than a voltage required for normal displaying of the main sub-pixel. The low-voltage gamma module 22 can be realized by display parameter look-up-table, and can also be realized by input data having the same function as the display parameter look-up-table, that is, by searching other data table of the corresponding output data or storage medium such as RAM according to the input data.

Figure 4:
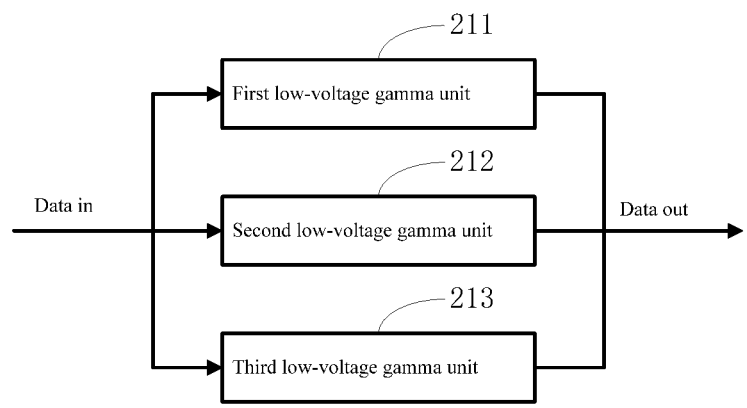
FIG. 4 illustrates a schematic structural diagram of a low-voltage gamma module provided by embodiment one of the present application.

As shown in FIG. 4, in this embodiment, the high-voltage gamma module 22 includes:

a first low-voltage gamma unit 221 configured to adjust the voltage of the drive signal corresponding to the main sub-pixel of the first color in the driving data to be the first low voltage to obtain and output a first driving data, upon receiving of the driving data;

a second low-voltage gamma unit 222 configured to adjust the voltage of the drive signal corresponding to the main sub-pixel of the second color in the driving data to be the second low voltage to obtain the first driving data and output the first driving data, when the drive data is received;

a third low-voltage gamma unit 223 configured to adjust the voltage of the drive signal corresponding to the main sub-pixel of the third color in the driving data to be the third low voltage to obtain and output a first driving data, upon receiving of the driving data;

Wherein, the input of the first low-voltage gamma unit 221, the input of the second low-voltage gamma unit 222 and the input of the third low-voltage gamma unit 223 are in common connection to form the input (Date in) of the low-voltage gamma module 22; the output of the first low-voltage gamma unit 221, the output of the second low-voltage gamma unit 222 and the output of the third low-voltage gamma unit 223 are in common connection to form the output (Data out) of the low-voltage gamma module 22.

In application, the first low-voltage gamma unit 221, the second low-voltage gamma unit 222 and the third low-voltage gamma unit 223 respectively include the display parameter look-up-table, are realized by the display parameter look-up-table, and can also be realized by input data having the same function as the display parameter look-up-table, that is, by searching other data table of the corresponding output data or storage medium such as RAM according to the input data.

In application, the first color, the second color and the third color are different from each other and are respectively one of red, green and blue. The first low voltage is lower than the voltage required for normal displaying of the main sub-pixel of the first color, the second low voltage is lower than the voltage required for normal displaying of the sub-pixel of the second color, and the third low voltage is lower than the voltage required for displaying when the main sub-pixel of the third color is normal.

The program modules further include a first selection module 23, the first input of the first selection module 23 is connected with the output of the high-voltage gamma module 21, the second input of the first selection module 23 is connected with the output of the low-voltage gamma module 22, the first selection module 23 is configured to select a target drive signal corresponding to the target sub-pixel from the first driving data or from the second driving data and output the target drive signal according to the arrangement of sub-pixels in the pixel array, upon receiving of the first driving data and the second driving data.

In application, since the drive signal in the driving data is set according to the arrangement of sub-pixels in the pixel array, therefore, the first selection module can obtain the color and the primary attribute and the secondary attribute of the target sub-pixel that needs to be driven currently by pre-selecting and storing the arrangement of the sub-pixels in the pixel array, and then select the corresponding drive signal from the first driving data and the second driving data according to the color and the primary attribute and the secondary attribute of the target sub-pixel and output the drive signal to the pixel array to drive the target sub-pixel. For example, if the target sub-pixel is the first color sub-pixel, the target drive signal is the drive signal with the voltage being the first high voltage in the first driving data which is output by the high-voltage gamma module.

In application, the first selection module can be implemented by a processor having data processing function, the processor can be implemented by general purpose integrated circuit such as CPU (Central Processing Unit), or by ASIC (Application Specific Integrated Circuit), and can also be a display drive board of a display device.

In this embodiment, each of sub-pixels in the display panel is divided into a main sub-pixel and a subordinate sub-pixel, so that the primary attribute and the secondary attribute of any two adjacent sub-pixels are different; then, the viewing angle of human eyes when the display panel is watched by human eyes is detected, upon receiving of the driving data, the gain value of the driving data is adjusted according to the viewing angle, the voltage of the drive signal corresponding to the main sub-pixel in the driving data is adjusted into a high voltage, and the first driving data is obtained; the voltage of the drive signal corresponding to the subordinate sub-pixel in the driving data is adjusted into a low voltage, and the second driving data is obtained. The target drive signal corresponding to the target sub-pixel is selected from the first driving data or from the second driving data and is output to the display panel to drive the target sub-pixels; by mixing and displaying the sub-pixels and the sub-pixels under different voltages, a viewing angle of chromaticity is improved, and a function of large viewing angle is achieved.

Embodiment Two

Figure 5:
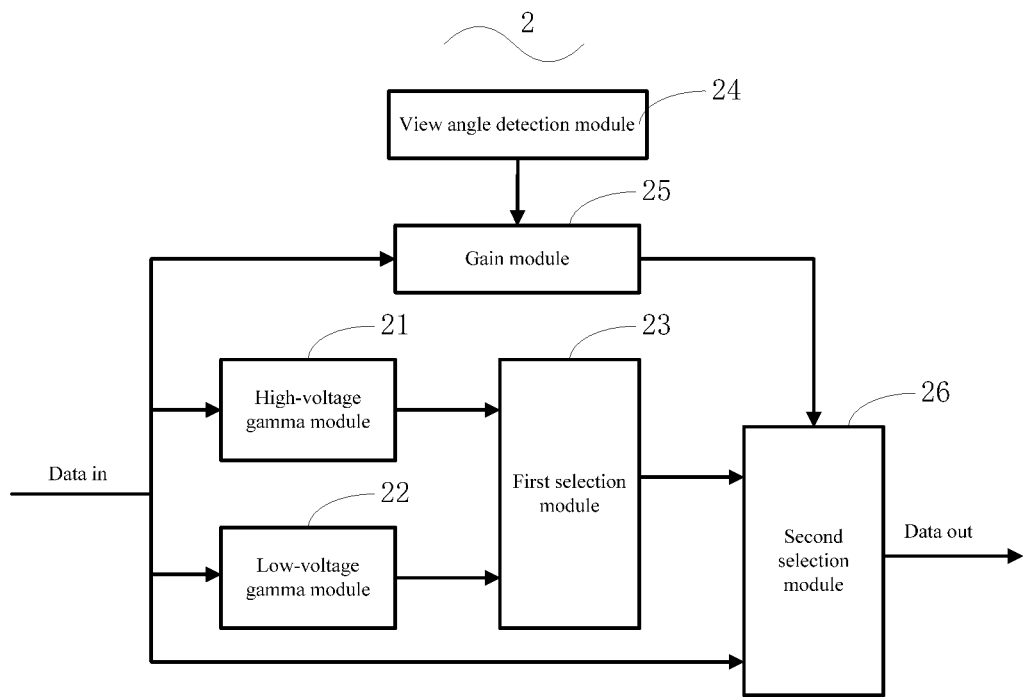
FIG. 5 illustrates a schematic structural diagram of the image control device provided by embodiment two of the present application.

As shown in FIG. 5, in this embodiment, the program modules in the first embodiment further includes:

a viewing angle detection module 24 configured to detect a viewing angle of human eyes when the display panel is watched by the human eyes.

In application, the viewing angle detection module obtains the viewing angle mainly by detecting an included angle between a vertical direction of a display panel and a sight direction of human eyes. The viewing angle detection module can be realized through technologies such as sight tracking, eyeball tracking and the like, for example, the viewing angle detection angle can be realized by a processor having a camera and a viewing angle detection function. The processor may be implemented by a general-purpose integrated circuit such as CPU or ASIC (Application Specific Integrated Circuit), and can also be a display drive board of a display device.

Figure 6:
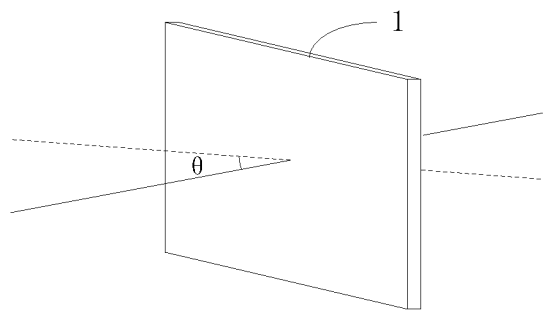
FIG. 6 illustrates a schematic view of a viewing angle provided by embodiment two of the present application.

As shown in FIG. 6, FIG. 6 exemplarily shows an included angle θ between the human eye sight direction (dotted lines) and a vertical direction (straight line) of a display panel 1, that is, the viewing angle.

The program modules further include a gain module 25, a first input of the gain module 25, an input of the low-voltage gamma module 22 and an input of a high-voltage gamma module 21 are in common connection, a second input of the gain module 25 is connected with an output of the viewing angle detection module 24, the gain module 25 is configured to adjust gain value of the driving data according to the viewing angle and output the driving data, upon receiving of the driving data.

In application, the gain module 25 is configured to be triggered by the driving data to obtain the gain value corresponding to the viewing angle that is detected by the viewing angle detection module currently, and outputs the gain value, when the drive data is received. The viewing angle and the gain value have a corresponding relation, the corresponding relation can be a positive correlation relationship, and the positive correlation relationship can be linear positive correlation or nonlinear positive correlation. For example, the viewing angle and the gain value can be in a linear positive correlation relationship with a fixed ratio, and can also be in a positive correlation relationship with a ratio as exponential function.

In application, a value range of the viewing angle is [0°, 90°], and a value range of the gain value is [0, +∞), the value of the gain value can be infinite theoretically, but cannot be infinity actually.

Figure 7:
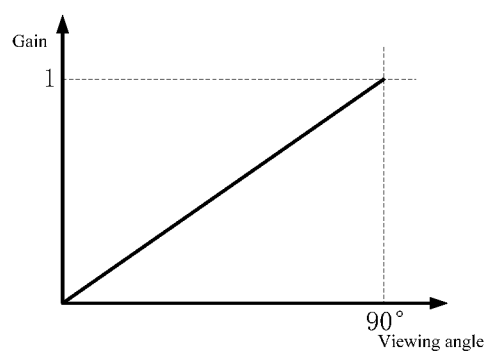
FIG. 7 illustrates a schematic view of a correlation between viewing angle and gain curve provided by embodiment two of the present application.

As shown in FIG. 7, FIG. 7 exemplarily shows a schematic view of viewing angle-gain curve when the viewing angle and the gain value can be linear positive correlation relationship with fixed ratio. A coordinate of a horizontal axis represents the viewing angle, a coordinate of a longitudinal axis represents the gain value, a value range of the viewing angle is [0°, 90°], and the value range of the gain value is [0, 1].

In application, the gain module 25 can be realized by displaying a look-up-table, and can also be realized by other data having the same function as display parameter look-up-table, that is, by searching other data tables of corresponding output data or storage medium such as RAM according to the input data.

A second selection module 26, a first input of the second selection module 26 is connected with a first input of the first selection module 26, a second input of the second selection module 26 is connected with a first input of the gain module 25, a gain input of the second selection module 26 is connected with an output of the gain module 25, the second selection module 26 is configured to adjust a voltage of a target drive signal according to the gain value and output the voltage to a pixel array to drive a target sub-pixel, when the gain value is greater than a gain threshold value; the second selection module 26 is further configured to, when the gain value is less than or equal to the gain threshold value, directly output the driving data to the pixel array.

In application, the gain threshold value can be set according to actual needs, when the viewing angle is small, that is, a sight line of human eyes is close to the front view of the display panel, a large viewing angle function can be closed, the driving data can be directly output to the pixel array in order that the power consumption is reduced. The gain threshold value may be set as arbitrary value equal or close to zero such as arbitrary value between 0 and 0.1. In one embodiment, the gain threshold is 0, or 0.05 or 0.1.

According to the embodiment, when the gain value is greater than the gain threshold value, the voltage of the target drive signal is adjusted according to the gain value and is output to the display panel to drive the target sub-pixel; when the gain value is less than or equal to the gain threshold value, the driving data is directly output to the display panel; the large viewing angle function can be closed when human eyes directly face the display panel, the performance of large viewing angle of the display panel can be dynamically adjusted according to the viewing angle of human eyes, opening and closing of the function of large viewing angle can be controlled, and power consumption can be reduced.

Embodiment Three

Figure 8:
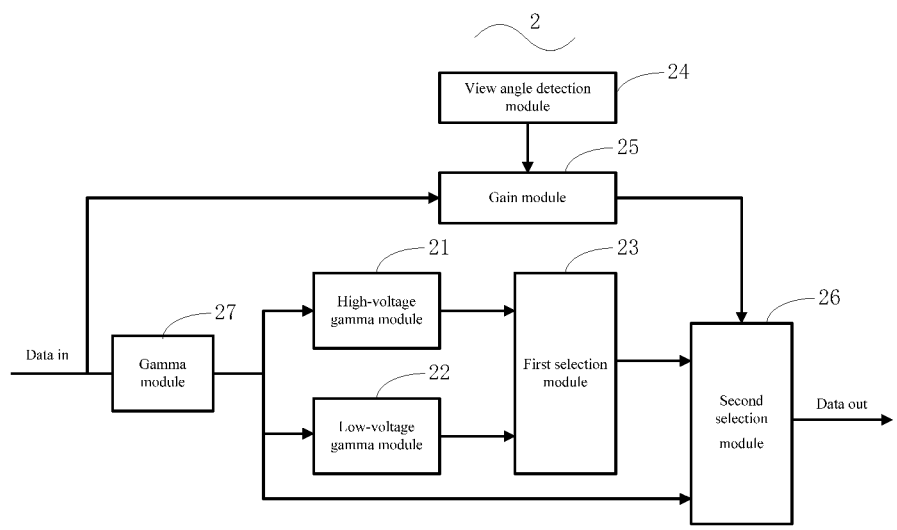
FIG. 8 and FIG. 9 respectively illustrate a schematic structural diagram of the image control device provided by embodiment three of the present application.

As shown in FIG. 8, in this embodiment, the program modules in the second embodiment further includes:

a gamma module 27, an input of the gamma module 27 is connected with a first input of a gain module 25, an output of the gamma module 27 is connected with an input of a high-voltage gamma module 21, an input of a low-voltage gamma module 22 is connected with a second input of a second selection module 26, the gamma module 27 is configured to adjust a gain of a drive signal corresponding to each of sub-pixels of various colors in the driving data and output the gain in order that a chromaticity coordinate of the pixel array 1 be adjusted to be an expected chromaticity coordinate, upon receiving of the driving data.

Figure 9:
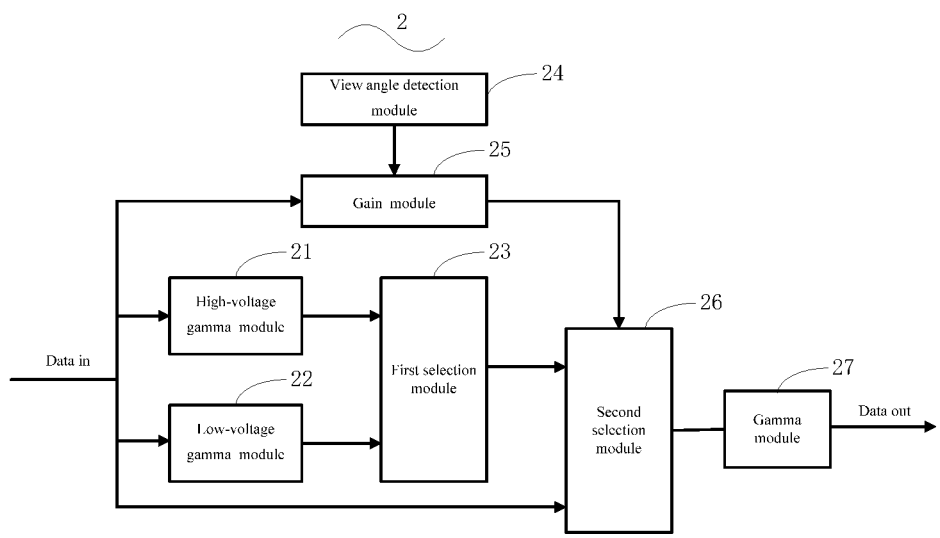

Alternatively, as shown in FIG. 9, in this embodiment, the program modules in embodiment two further includes:

a gamma module 27', an input of the gamma module 27' is connected with an output of the second selection module 26, the gamma module 27' is configured to adjust the gain of the target drive signal and output the gain to adjust the chromaticity coordinate of the pixel array 1 to be a desired chromaticity coordinate, when a target drive signal is received.

As shown in FIG. 8 or FIG. 9, in this embodiment, the gamma module 27 may have two arrangements, one arrangement is arranging the gamma module 27 at a data input of the image control device 2, the other arrangement is arranging the gamma module 27 at a data output of the image control device 2, no matter where the gamma module 27 is arranged, the gamma module 27 is configured to adjust white balance of the display panel.

In application, the gamma module 27 can be realized by displaying a look-up-table, and can also be realized by other data having the same function as display parameter look-up-table, that is, by searching other data tables of corresponding output data or storage medium such as RAM according to the input data.

Figure 10:
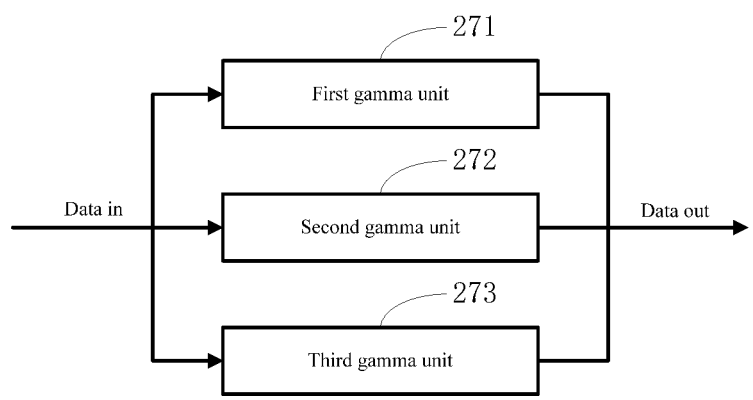
FIG. 10 illustrates a schematic structural diagram of a gamma module provided by embodiment three of the present application.

As shown in FIG. 10, in this embodiment, the gamma module 27 includes:

a first gamma unit 271 configured to, when a drive signal corresponding to a first color sub-pixel is received, adjust a gain of the drive signal corresponding to the first color sub-pixel and output the gain of the drive signal corresponding to the first color sub-pixel;

a second gamma unit 272 configured to, when a drive signal corresponding to a second color sub-pixel is received, adjust a gain of the drive signal corresponding to the second color sub-pixel and output the gain of the drive signal corresponding to the second color sub-pixel;

a third gamma unit 273 configured to, when a drive signal corresponding to a third color sub-pixel is received, adjust a gain of the drive signal corresponding to the third color sub-pixel and output the gain of the drive signal corresponding to the third color sub-pixel.

Wherein, an input of the first gamma unit 271, an input of the second gamma unit 272 and an input of the third gamma unit 273 are in common connection to form the input (Data in) of the gamma module 27; an output of the first gamma unit 271, an output of the second gamma unit 272 and an output of the third gamma unit 273 are in common connection to form the output (Data out) of the gamma module 27.

In application, each of the first gamma unit 271, the second gamma unit 272 and the third gamma unit 273 includes a display parameter look-up-table and is realized by the display parameter look-up-table, and can also be realized by other data having the same function as the display parameter look-up-table, that is, by searching other data tables of corresponding output data or storage medium such as RAM according to the input data. The first color, the second color and the third color are different from each other and are one of red, green and blue respectively.

Embodiment Four

This embodiment provides an image control method which is implemented based on any one of embodiment one, embodiment two and embodiment three, and can also be implemented based on a software program in a processor of a display device. The processor can be implemented by a general-purpose integrated circuit, such as CPU or ASIC, and can also be implemented by a display drive board of the display device.

Figure 11:
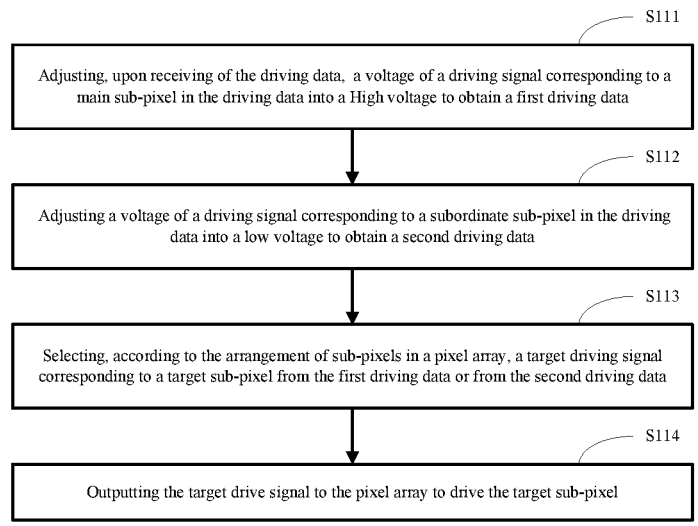
FIG. 11 and FIG. 12 respectively illustrate a schematic flow chart of an image control method provided by embodiment four of the present application.

As shown in FIG. 11, the image control method includes:

step 111, adjusting, upon receiving of driving data, the voltage corresponding to a main sub-pixel in the driving data into a high voltage to obtain first driving data;

step 112, adjusting the voltage corresponding to subordinate sub-pixel in the driving data into a low voltage to obtain second driving data;

step 113, selecting a target drive signal corresponding to the target sub-pixel from the first driving data or from the second driving data, according to the arrangement of sub-pixels in a pixel array; and step 114, outputting the target drive signal to the pixel array to drive the target sub-pixel.

Figure 12:
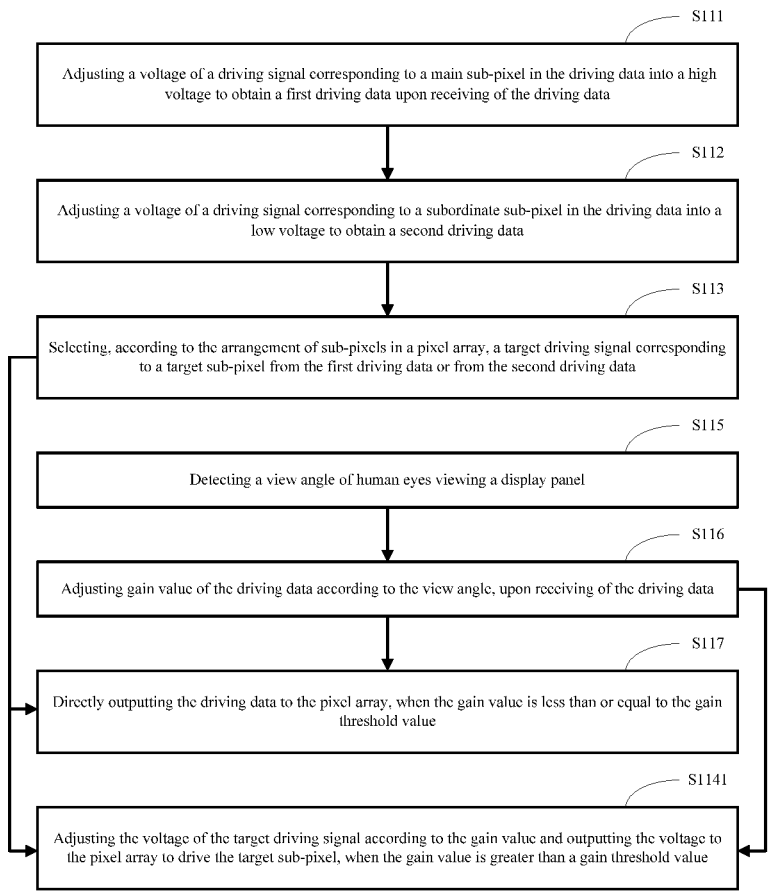

As shown in FIG. 12, in this embodiment, before the step 114, the image control method further includes:

step 115, detecting a viewing angle of human eyes viewing a display panel;

step 116, adjusting the gain value of the driving data according to the viewing angle, upon receiving of the driving data;

step 117, directly outputting the driving data to a pixel array when the gain value is less than or equal to a gain threshold value;

Correspondingly, step 114 includes:

step 1141, adjusting the voltage of the target drive signal according to the gain value and outputting the voltage to the pixel array to drive the target sub-pixel, when the gain value is greater than the gain threshold value.

In this embodiment, each of sub-pixels in the display panel is divided into a main sub-pixel and a subordinate sub-pixel, so that the primary attribute and the secondary attribute of any two adjacent sub-pixels are different; then, the viewing angle of human eyes when the display panel is watched by human eyes is detected, upon receiving of the driving data, the gain value of the driving data is adjusted according to the viewing angle, the voltage of the drive signal corresponding to the main sub-pixel in the driving data is adjusted into a high voltage, and the first driving data is obtained; the voltage of the drive signal corresponding to the subordinate sub-pixel in the driving data is adjusted into a low voltage, and the second driving data is obtained. The target drive signal corresponding to the target sub-pixel is selected from the first driving data or from the second driving data and is output to the display panel to drive the target sub-pixels; by mixing and displaying the sub-pixels and the sub-pixels under different voltages, a viewing angle of chromaticity is improved, and a large viewing angle function is achieved.

When the gain value is greater than the gain threshold value, the voltage of the target drive signal is adjusted according to the gain value and is output to the display panel to drive the target sub-pixel; when the gain value is less than or equal to the gain threshold value, the driving data is directly output to the display panel; the large viewing angle function can be closed when human eyes directly face the display panel, the large viewing angle performance of the display panel can be dynamically adjusted according to the viewing angle of human eyes, opening and closing of the large viewing angle function can be controlled, and power consumption can be reduced.

Embodiment Five

Figure 13:
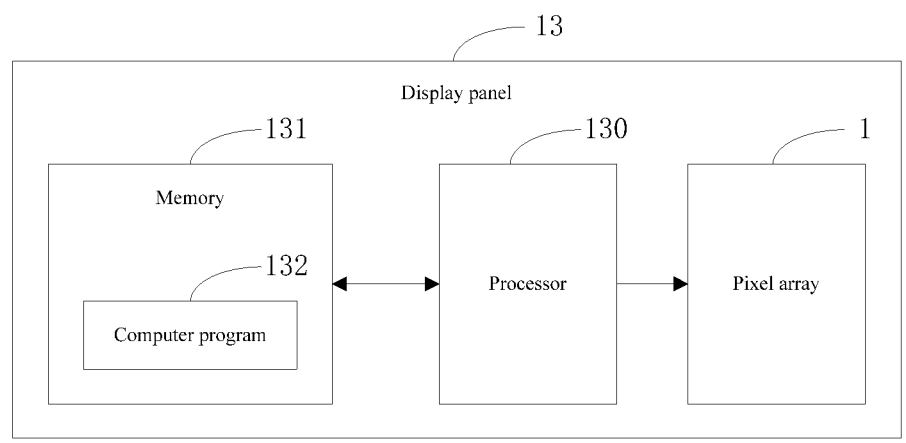
FIG. 13 illustrates a schematic structural diagram of a display panel provided by embodiment five of the present application.

As shown in FIG. 13, this embodiment provides a display panel 13 which includes: a pixel array 1, a processor 130, a memory 131, and a computer program 132 stored in the memory 131 and executable by the processor 130 such as an image control program. When the computer program is executed by the processor 130, the processor 130 is configured to implement the steps in the aforesaid image control method embodiment, such as steps 101-104 shown in FIG. 1. Or as an alternative, when the computer program is executed by the processor 130, the processor 130 is configured to implement the functions of the various modules/units in the various device embodiments such as the functions of the modules 21-23 shown in FIG. 2.

Exemplarily, the computer program 132 may be divided into one or more modules/units, the one or more modules/units are stored in the memory 131 and is/are executed by the processor 130 so as to complete the present application. The one or more modules/units may be a series of computer program instruction segments capable of completing particular function, these instruction sections are programmed for describing an execution process of the computer program 132 in the display panel 13. For example, the computer program 132 may be divided into a high voltage gamma module, a low voltage gamma module, a first selection module, a viewing angle detection module, a gain module, a second selection module and a gamma module, where functions of the various modules are as follows:

the high-voltage gamma module is configured to, upon receiving of driving data, adjust a voltage of a drive signal corresponding to a main sub-pixel in the driving data into a high voltage to obtain and output a first driving data;

a low-voltage gamma module is configured to adjust, upon receiving of the driving data, a voltage of the drive signal corresponding to a subordinate sub-pixel in the driving data into a low voltage to obtain and output a second driving data;

a first selection module is configured to select a target drive signal corresponding to a target sub-pixel from the first driving data or from the second driving data according to the arrangement of sub-pixels in a pixel array, upon receiving of the first driving data and the second driving data;

a viewing angle detection module is configured to detect a viewing angle of human eyes viewing a display panel;

the gain module is configured to adjust gain value of the driving data according to the viewing angle and output the gain value, upon receiving of the driving data;

the second selection module is configured to adjust the voltage of the target drive signal according to the gain value and output the voltage to the pixel array to drive the target sub-pixel when the gain value is greater than a gain threshold value, and is further configured to directly output the driving data to the pixel array when the gain value is less than or equal to the gain threshold value.

the gamma module is configured to adjust and output gains of drive signals corresponding to sub-pixels of various colors in the driving data in order to adjust a chromaticity coordinate of the pixel array as a desired chromaticity coordinate, upon receiving of the driving data; or is alternatively configured to adjust and output the gain of the target drive signal in order to adjust the chromaticity coordinate of the pixel array as the desired chromaticity coordinate, upon receiving of the driving data.

The display panel 13 can include but is not limited to the pixel array 1, the processor 130, and the memory 131. The one of ordinary skill in the art can understood that, FIG. 13 is merely an example of the display panel 13 and is not constituted as limitation to the display panel 13, more or less components shown in FIG. 13 can be included, or some components or different components can be combined; for example, the display panel 13 can also include an input and output device, a network access device, a bus, etc.

The so called processor 80 can be CPU, and can also be other general purpose processor, DSP (Digital Signal Processor), ASIC, FGPA (Field-Programmable Gate Array), or some other programmable logic devices, discrete gate or transistor logic device, discrete hardware component, etc., and can also be a display drive board of the display device.

The memory 131 can be an internal storage unit of the display panel 13, such as a hard disk or a memory of the display panel 13. The memory 131 can also be an external storage device of the display panel 13, such as a plug-in hard disk, a SMC (Smart Media Card), a SD (Secure Digital) card, a FC (Flash Card) equipped on the display panel 13. Further, the memory 131 may include both the internal storage unit and the external storage device of the display panel 13, either. The memory 131 is configured to store the computer programs, and other procedures and data needed by the display panel 13. The memory 131 can also be configured to store data that has been output or being ready to be output temporarily.

In one embodiment, the display panel 201 can be any type of display panel such as a liquid crystal display panel based on LCD (Liquid Crystal Display) technology, an OLED (Organic Electroluminesence Display) panel based on OLED technology, a QLED (Quantum Dot Light Emitting Diodes) display panel based on QLED technology, and so on.

In one embodiment, all modules or units in the embodiment of the present application can be implemented by general purpose integrated circuit such as CPU, or be implemented by ASIC.

The one of ordinary skill in the art can understand that, a whole or part of flow process of implementing the method in the aforesaid embodiments of the present application can also be accomplished by using computer program to instruct relevant hardware. The computer program can be stored in a computer readable storage medium, when the computer program is executed, the steps in the various method embodiments described above can be included. Wherein, the storage medium can be a hard disk, an optical disk, a ROM (Read-Only Memory), a RAM and so on.

The aforementioned embodiments are only preferred embodiments of the present application, and should not be regarded as being limitation to the present application. Any modification, equivalent replacement, improvement, and so on, which are made within the spirit and the principle of the present application, should be included in the protection scope of the present application.

What is claimed is:

1. An image control device, comprising:
a memory; and
a processor;
wherein the processor is configured to execute program modules stored in the memory to implement image control, and wherein the program modules comprise:
a high-voltage gamma module configured to, upon receiving of driving data, adjust a voltage of a drive signal corresponding to a main sub-pixel in the driving data into a high voltage to obtain and output a first driving data;
a low-voltage gamma module, wherein an input of the low-voltage gamma module is connected with an input of the high-voltage gamma module, and the low-voltage gamma module is configured to adjust, upon receiving of the driving data, a voltage of the drive signal corresponding to a subordinate sub-pixel in the driving data into a low voltage to obtain and output a second driving data;

a first selection module, wherein a first input of the first selection module is connected with an output of the high-voltage gamma module, a second input of the first selection module is connected with an output of the low-voltage gamma module, and the first selection module is configured to select and output a target drive signal corresponding to a target sub-pixel from the first driving data or from the second driving data according to the arrangement of sub-pixels in a pixel array, upon receiving of the first driving data and the second driving data;

a viewing angle detection module configured to detect a viewing angle of human eyes viewing a display panel;

a gain module, wherein a first input of the gain module, the input of the low-voltage gamma module and the input of the high-voltage gamma module are in common connection, a second input of the gain module is connected with an output of the viewing angle detection module, and the gain module is configured to adjust and output a gain value of the driving data according to the viewing angle, upon receiving of the driving data; and a second selection module, wherein a first input of the second selection module is connected with the output of the first selection module, a second input of the second selection module is connected with the first input of the gain module, a gain input of the second selection module is connected with the output of the gain module, and the second selection module is configured to adjust the voltage of the target drive signal according to the gain value and output the adjusted voltage to the pixel array to drive the target sub-pixel when the gain value is greater than a gain threshold value, and is further configured to directly output the driving data to the pixel array when the gain value is less than or equal to the gain threshold value.

2. The image control device according to claim 1, wherein the program modules further comprise:

a first gamma module, wherein an input of the first gamma module is connected with the first input of the gain module, an output of the first gamma module is connected with the input of the high-voltage gamma module, the input of the low-voltage gamma module and the second input of the second selection module, and the first gamma module is configured to adjust and output gains of drive signals corresponding to sub-pixels of various colors in the driving data, upon receiving of the driving data.

3. The image control device according to claim 2, wherein the first gamma module comprises:

a first gamma unit configured to adjust, when a drive signal corresponding to a first color sub-pixel is received, the gain of the drive signal corresponding to the first color sub-pixel and output the gain of the drive signal corresponding to the first color sub-pixel;

a second gamma unit configured to adjust, when a drive signal corresponding to a second color sub-pixel is received, the gain of the drive signal corresponding to the second color sub-pixel and output the gain of the drive signal corresponding to the second color sub-pixel;

a third gamma unit configured to adjust, when a drive signal corresponding to a third color sub-pixel is received, the gain of the drive signal corresponding to the third color sub-pixel and output the gain of the drive signal corresponding to the third color sub-pixel;

wherein, the input of the first gamma unit, the input of the second gamma unit and the input of the third gamma unit are in common connection to form the input of the gamma module, the output of the first gamma unit, the output of the second gamma unit and the output of the third gamma unit are in common connection to form the output of the gamma module.

4. The image control device according to claim 3, wherein the first gamma unit, the second gamma unit and the third gamma unit comprise a display parameter look-up-table.

5. The image control device according to claim 1, wherein the program modules further comprise:

a second gamma module, wherein an input of the second gamma module is connected with the output of the second selection module, and the second gamma module is configured to adjust and output the gain of the target drive signal in order that a chromaticity coordinate of the pixel array be adjusted as an expected chromaticity coordinate, upon receiving of the target drive signal.

6. The image control device according to claim 1, wherein a value range of the viewing angle is [0° C., 90° C.].

7. The image control device according to claim 1, wherein the value range of the gain value is [0, +∞).

8. The image control device according to claim 1, wherein the value range of the gain threshold is 0-0.1.

9. The image control device according to claim 1, wherein the high-voltage gamma module comprises:

a first high-voltage gamma unit configured to adjust a voltage of a drive signal corresponding to a first color main sub-pixel in the driving data to be a first high voltage to obtain the first driving data and output the first driving data, upon receiving of the driving data;

a second high-voltage gamma unit configured to adjust a voltage of a drive signal corresponding to a second color main sub-pixel in the driving data to be a second high voltage to obtain the first driving data and output the first driving data, upon receiving of the driving data;

a third high-voltage gamma unit configured to adjust a voltage of a drive signal corresponding to a third color main sub-pixel in the driving data to be a third high voltage to obtain the first driving data and output the first driving data, upon receiving of the driving data;

the low-voltage gamma module comprises:

a first low-voltage gamma unit configured to adjust the voltage of the drive signal corresponding to the main sub-pixel of the first color in the driving data to be a first low voltage to obtain the second driving data and output the second driving data, upon receiving of the driving data;

a second low-voltage gamma unit configured to adjust the voltage of the drive signal corresponding to the second color main sub-pixel in the driving data to be a second low voltage to obtain the second driving data and output the second driving data, upon receiving of the driving data; and a third low-voltage gamma unit configured to adjust the voltage of the drive signal corresponding to the third color main sub-pixel in the driving data to be a third low voltage to obtain the second driving data and output the second driving data, upon receiving of the driving data;

wherein the input of the first high-voltage gamma unit, the input of the second high-voltage gamma unit and the input of the third high-voltage gamma unit are in common connection to form the input of the high-voltage gamma module, the output of the second high-voltage gamma unit, the output of the second high-voltage gamma unit and the output of the third high-voltage gamma unit are in common connection to form the output of the high-voltage gamma module; and wherein the input of the first low-voltage gamma unit, the input of the second low-voltage gamma unit and the input of the third low-voltage gamma unit are in common connection to form the input of the low-voltage gamma module, the output of the first low-voltage gamma unit, the output of the second low-voltage gamma unit and the output of the third low-voltage gamma unit are in common connection to form the output of the low-voltage gamma module.

10. The image control device according to claim 9, wherein each of the first high-voltage gamma unit, the second high-voltage gamma unit and the third high-voltage gamma unit comprises a display parameter look-up-table; and each of the first low-voltage gamma unit, the second low-voltage gamma unit and the third low-voltage gamma unit comprises a display parameter look-up-table.

11. The image control device according to claim 9, wherein the first high voltage is higher than a voltage required for normal displaying of the main sub-pixel of the first color, and the second high voltage is higher than a voltage required for normal displaying of the second color main sub-pixel, the third high-voltage is higher than a voltage required for normal displaying of the third color main sub-pixel; and wherein the first low voltage is lower than a voltage required for normal displaying of the main sub-pixel of the first color, the second low voltage is lower than a voltage required for normal displaying of the second color main sub-pixel, and the third low voltage is lower than a voltage required for normal displaying of the third main sub-pixel.

12. The image control device according to claim 1, wherein the high-voltage gamma module comprises a display parameter look-up-table; and wherein the low-voltage gamma module comprises a display parameter look-up-table.

13. The image control device according to claim 1, wherein the image control device is applied to the pixel array, the pixel array comprises a plurality of pixels, a sub-pixel of each of the pixels is divided into a main sub-pixel and a subordinate sub-pixel, an adjacent sub-pixel of any main sub-pixel in the pixel array is the subordinate sub-pixel, and an adjacent sub-pixel of any subordinate sub-pixel is the main sub-pixel.

14. The image control device according to claim 13, wherein each pixel comprises at least three sub-pixels of red, green and blue colors.

15. The image control device according to claim 14, wherein each pixel further comprises a fourth sub-pixel.

16. The image control device according to claim 15, wherein the color of the fourth sub-pixel is white or yellow.

* * * * *